(12) United States Patent
Kim

(10) Patent No.: US 8,486,819 B2
(45) Date of Patent: Jul. 16, 2013

(54) SEMICONDUCTOR DEVICE AND METHOD OF MANUFACTURING THE SAME

(75) Inventor: Wan Soo Kim, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 128 days.

(21) Appl. No.: 13/175,202

(22) Filed: Jul. 1, 2011

(65) Prior Publication Data

US 2012/0001258 A1    Jan. 5, 2012

(30) Foreign Application Priority Data

Jul. 1, 2010    (KR) ........................ 10-2010-0063421

(51) Int. Cl.
*H01L 29/78*    (2006.01)
*H01L 21/336*    (2006.01)

(52) U.S. Cl.
USPC    438/589; 257/412; 257/E21.41; 257/E29.262

(58) Field of Classification Search
None
See application file for complete search history.

(56) References Cited

U.S. PATENT DOCUMENTS

| | | | | |
|---|---|---|---|---|
| 4,961,822 A | * | 10/1990 | Liao et al. | 438/628 |
| 5,219,789 A | * | 6/1993 | Adan | 438/645 |
| 7,592,210 B2 | * | 9/2009 | Chung et al. | 438/156 |
| 7,786,528 B2 | * | 8/2010 | Hsieh | 257/328 |
| 7,935,595 B2 | * | 5/2011 | Shiratake | 438/257 |
| 8,178,922 B2 | * | 5/2012 | Hsieh | 257/330 |
| 2004/0209425 A1 | * | 10/2004 | Harada | 438/259 |
| 2006/0286728 A1 | * | 12/2006 | Kim | 438/180 |
| 2006/0292764 A1 | * | 12/2006 | Harada | 438/156 |
| 2007/0221991 A1 | * | 9/2007 | Chung et al. | 257/347 |
| 2008/0121990 A1 | * | 5/2008 | Hasunuma | 257/333 |
| 2008/0153235 A1 | * | 6/2008 | Inagawa et al. | 438/270 |
| 2009/0078995 A1 | * | 3/2009 | Nakagawa et al. | 257/330 |
| 2010/0072541 A1 | * | 3/2010 | Chung et al. | 257/330 |
| 2010/0072545 A1 | * | 3/2010 | Ryu et al. | 257/334 |
| 2010/0099230 A1 | * | 4/2010 | Tai et al. | 438/270 |
| 2011/0018057 A1 | * | 1/2011 | Kim | 257/330 |
| 2012/0196416 A1 | * | 8/2012 | Hsieh | 438/270 |
| 2012/0196436 A1 | * | 8/2012 | Jung et al. | 438/647 |

FOREIGN PATENT DOCUMENTS

| | | |
|---|---|---|
| KR | 1020060039733 A | 5/2006 |
| KR | 1020080003055 A | 1/2008 |
| KR | 1020080089016 A | 10/2008 |
| KR | 1020100030019 A | 3/2010 |

OTHER PUBLICATIONS

Machine translation of KR 10-2008-0003055.*
Machine translation of KR 10-2008-0089016.*
Machine translation of KR 10-2010-0030019.*
Machine translation of KR 10-2004-0099941.*

(Continued)

*Primary Examiner* — Thomas L Dickey
*Assistant Examiner* — Joseph Schoenholtz

(57) ABSTRACT

A semiconductor device includes a gate metal buried within a trench included in a semiconductor substrate including an active region defined by an isolation layer, a spacer pattern disposed on an upper portion of a sidewall of a gate metal, a first gate oxide layer disposed between the spacer pattern and the trench, a second gate oxide layer disposed below the first gate oxide layer and the gate metal, and a junction region disposed in the active region to overlap the first gate oxide layer.

11 Claims, 5 Drawing Sheets

OTHER PUBLICATIONS

Ryu, Seong-Wan. "Data Retention Characteristics for Gate Oxide Schemes in Sub-50 Nm Saddle-Fin Transistor Dynamic-Random-Access-Memory Technology." Jpn. J. Appl. Phys 50 (2011): 04DD01.*

Eun-Ae Chung, Young-Pil Kim, Kab-Jin Nam, Sungsam Lee, Ji-Young Min, Yu-Gyun Shin, Siyoung Choi, Gyoyoung Jin, Joo-Tae Moon, Sangsig Kim, Leakage current mechanisms in sub-50nm recess-channel-type DRAM cell transistors with three-terminal gate-controlled diodes, Solid-State Electronics, vol. 56, Issue 1, Feb. 2011, pp. 219-222.*

Myoung Jin Lee; et. al, Reliability Studies on Non Planar DRAM Cell Transistor, Reliability physics symposium, 2007. proceedings. 45th annual. IEEE International , pp. 660-661, Apr. 15-19, 2007.*

Kinam Kim; Gitae Jeong; , "Memory Technologies for sub-40nm Node," Electron Devices Meeting, 2007. IEDM 2007. IEEE International , pp. 27-30, Dec. 10-12, 2007.*

* cited by examiner

SEMICONDUCTOR DEVICE AND METHOD OF MANUFACTURING THE SAME

CROSS-REFERENCES TO RELATED APPLICATION

The present application claims priority to Korean patent application No. 10-2010-0063421 filed on 1 Jul. 2010, which is incorporated by reference in its entirety.

BACKGROUND OF THE INVENTION

1. Technical Field

The present invention relates to a semiconductor device with improved gate refresh characteristics and a method of fabricating the same.

2. Related Art

With the high integration degree of semiconductor devices, the size of an active region and a channel length of a transistor formed in the active region are reduced. As the channel length of a transistor is reduced, short channel effect or source/drain punch-through occurs, which negatively influences the electric field or electric potential in the channel of the transistor. For example, when a short channel effect is generated in an access transistor adapted to memory cells of dynamic random access memories (DRAMs), a threshold voltage of the DRAM cells is reduced and a leakage current increases, thereby degrading the refresh characteristics of DRAMs. Thus, in order to suppress the short channel effect, a method of increasing the gate channel length of the device formed on a substrate has been suggested. For example, even if the memory cells of a DRAM device are scaled down to a very small size, a transistor having a recessed channel retains fairly good refresh characteristics.

Hereinafter, a method of manufacturing a transistor having a recessed channel in the related art will be described. A source/drain region is formed by implanting impurities into a substrate. A mask opening a portion of the substrate in which a recessed channel is to be formed is formed and the exposed portion of the substrate is etched using the mask to form a trench in the substrate. Subsequently, a gate oxide layer is formed on an inner wall of the trench. At this time, the gate oxide layer includes a high dielectric (high-k) material layer such as a silicon oxide layer, a hafnium oxide layer and a hafnium silicon oxide layer. A gate conductive layer fills the trench. The gate conductive layer includes a stacking structure of polysilicon/metal or metal/polysilicon/metal, which has a lower resistance characteristic than polysilicon while having a property similar to polysilicon. The gate conductive layer is isotropically etched using a gate mask to form a gate electrode, thereby completing a transistor having the gate electrode and the source/drain.

Thus, as the integrity degree of the semiconductor device rapidly increases, in order to reduce a gate leakage current and power consumption, a high dielectric material layer is used as the gate oxide layer and a stacking structure, which includes a polysilicon layer on a metal layer, is formed on the high dielectric material layer as the gate conductive layer. However, when a transistor having a recessed channel is formed by the related art, due to low etch selectivity between the metal layer used as a gate conductive layer and the high dielectric material layer, when the high dielectric layer is etched to form the gate electrode, silicon substrate is removed.

On the other hand, as integrity of the semiconductor device increases, the thickness of the gate oxide layer is reduced to improve controllability of the gate. As a result, an electric field is concentrated at an area between the gates thus causing gate induced drain leakage (GIDL). That is, since an overlap between the gate and a junction region is increased by bridges between a word line and a bit line or between word lines, GIDL current is increased by direct tunneling between the gate electrode and the drain region. Such a GIDL current seriously degrades a semiconductor device, such as DRAM, having a recessed channel.

SUMMARY

The present invention is directed to providing a semiconductor device capable of preventing the degradation of refresh characteristics due to GIDL caused by concentration of an electric field in an overlap area between gates, which occurs when reducing the thickness of a gate oxide layer to improve controllability of a gate as the integrity of the semiconductor device increases, and a method of manufacturing the same.

According to one aspect of an exemplary embodiment, a semiconductor device includes a gate metal buried within a trench in a semiconductor substrate including an active region defined by a device isolation layer, a spacer pattern disposed on an upper portion of a sidewall of the gate metal, a first gate oxide layer disposed between the spacer pattern and the trench, a second gate oxide layer disposed below the first gate oxide layer and the gate metal, and a junction region disposed in the active region to overlap the first gate oxide layer.

The first gate oxide layer may have a thicker thickness than the second gate oxide layer.

The first gate oxide layer may have the thickness of 70 Å to 100 Å.

The second oxide layer may have a thickness of 50 Å to 60 Å.

The junction region and the gate metal may be spaced by the spacer pattern and the first gate oxide layer.

According to another aspect of another exemplary embodiment, a semiconductor device includes a first buried gate formed at a first level in a substrate; a second buried gate extending from the first buried gate and formed at a second level in the substrate, the second level being higher than the first level; a junction region formed at a side of the second buried gate at the second level; a spacer pattern formed between the junction region and the second buried gate at the second level; and a first gate oxide layer formed between the spacer pattern and the junction region, wherein a thickness and a material of the spacer pattern and the first gate oxide layer are configured to inhibit leakage between the buried gate and the junction region.

The device further comprising a second gate oxide layer formed between the first buried gate and the substrate, wherein the first gate oxide layer is formed to be thicker than the second gate oxide layer.

According to another aspect of another exemplary embodiment, a method of manufacturing a semiconductor device includes forming a trench in a semiconductor substrate including an active region defined by a device isolation layer, forming an insulating layer on an inner surface of the trench, forming a sacrificial metal pattern on the insulating layer to be filled within a lower portion of the trench, forming a spacer pattern at a sidewall of the trench on the sacrificial metal pattern, removing the sacrificial metal pattern, removing the insulating layer using the spacer pattern as a mask to form a first gate oxide layer, forming a second gate oxide layer on a surface of the trench from which the sacrificial metal pattern is removed, forming a gate metal on the second gate oxide layer to overlap the spacer pattern, and forming a junction region in the active region to overlap the first gate oxide layer by performing an ion implantation process.

The forming the trench may include forming a hard mask pattern on the semiconductor substrate and etching the semiconductor substrate using the hard mask pattern as a mask.

The forming the insulating layer on the inner surface of the trench may include oxidizing a surface of the trench.

The forming the insulating layer on the inner surface of the trench may include forming an oxide layer having a thickness of 70 Å to 100 Å.

The forming the sacrificial metal pattern may include forming a sacrificial metal layer on the insulating layer and performing an etching back process for the sacrificial metal layer by taking a channel region, which is to be formed within the semiconductor substrate, into consideration.

The forming the spacer pattern may include forming a spacer insulating layer on the sacrificial metal pattern and the insulating layer and performing an etching back process for the spacer insulating layer.

The removing the insulating layer may include performing a cleaning process for the insulating layer.

The forming the second oxide layer may include oxidizing a surface of the trench exposed by the spacer pattern.

The forming the second oxide layer may include forming an oxide layer having a thickness of 50 Å to 60 Å.

The method may further include forming an insulating layer on the gate metal after forming the gate metal.

According to another aspect of another exemplary embodiment, a method of manufacturing a semiconductor device includes forming a trench in a substrate, wherein the trench includes a lower part located at a first level and an upper part located at a second level, forming an insulating layer over a surface of the trench at the first level and at the second level, forming a sacrificial metal pattern in the trench at the first level, forming a spacer pattern at a sidewall of the trench at the second level, removing the sacrificial metal pattern, removing the insulating layer at the first level and allowing the insulating layer at the second level to remain to form a first gate oxide layer, forming a gate electrode in the trench so as to extend from the first level to the second level and forming a junction region in the substrate at a side of the first gate oxide layer at the second level.

These and other features, aspects, and embodiments are described below in the section entitled "DESCRIPTION OF EXEMPLARY EMBODIMENT."

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Figure 1:
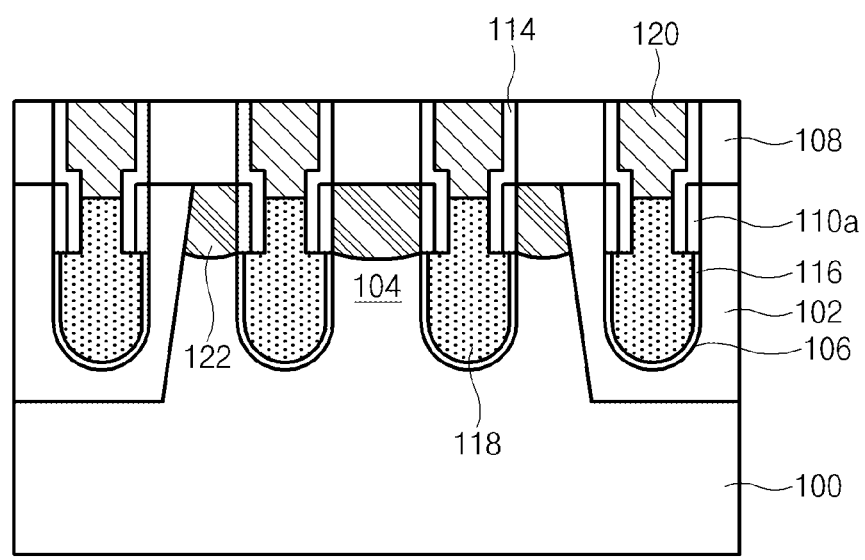
FIG. 1 is a cross-sectional view illustrating a semiconductor device according to an exemplary embodiment of the present invention.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

Hereinafter, exemplary embodiments of the present invention will be described with reference to accompanying drawings.

Referring to FIG. 1, a semiconductor device according to an exemplary embodiment of the present invention includes a gate metal 118 buried in a trench 106, which is formed in a semiconductor substrate including an active region defined by a device isolation layer 102; a spacer pattern 114 disposed over an upper portion of a sidewall of the gate metal 118; a first gate oxide layer 110a disposed between the spacer pattern 114 and a sidewall of the trench 106, a second gate oxide layer 116 disposed below the first gate oxide layer 110a and the gate metal 118; and a junction region 122 disposed in the active region to overlap the first gate oxide layer 110a.

The semiconductor device further includes an insulating layer 120 disposed over the gate metal 118 and a hard mask pattern 108 defining the trench 106. Here, a thickness of the first oxide layer 110a may be thicker than that of the second gate oxide layer 116. Specifically, the first gate oxide layer 110a may have a thickness of 70 Å to 100 Å and the second gate oxide layer 116 may have a thickness of 50 Å to 60 Å.

Hereinafter, a method of manufacturing a semiconductor device having the above-described structure according to an exemplary embodiment of the present invention will be described.

Figure 2A:
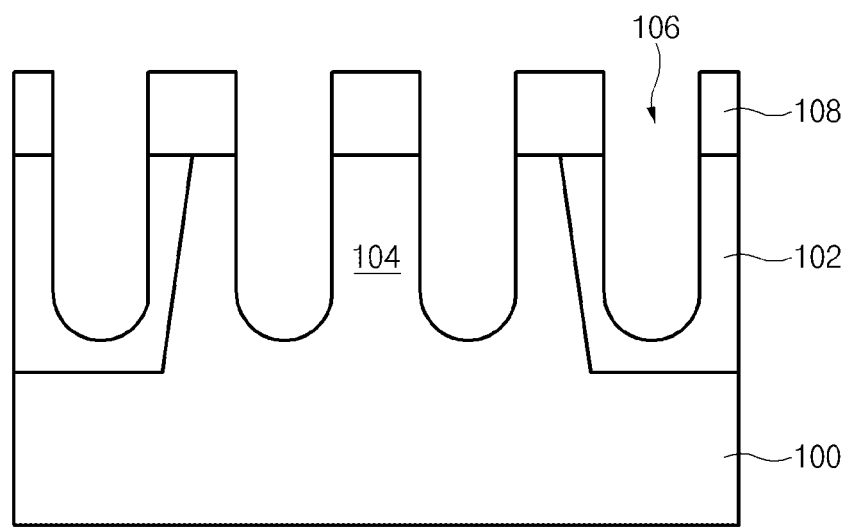
FIGS. 2A to 2H are cross-sectional views illustrating a method of manufacturing a semiconductor device according to an exemplary embodiment of the present invention.

Referring to FIG. 2A, a hard mask pattern 108 is formed on a semiconductor substrate 100, which includes an active region 104 defined by a device isolation layer 102. The semiconductor substrate 100 is etched using the hard mask pattern 108 as a mask to form a trench 106. The trench 106 may be a region where a gate is to be formed.

Figure 2B:
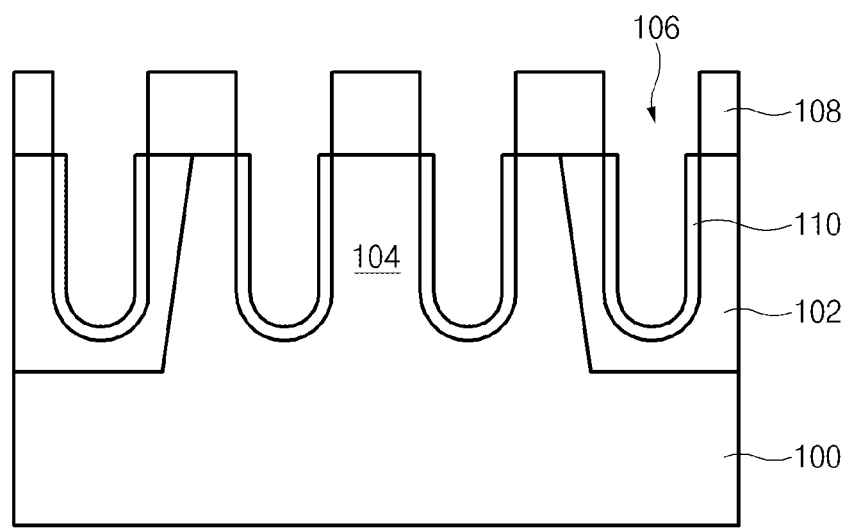

Referring to FIG. 2B, an insulating layer 110 is formed over the surface of the trench 106. Here, the insulating layer 110 may be formed to a thickness of 70 Å to 100 Å.

Figure 2C:
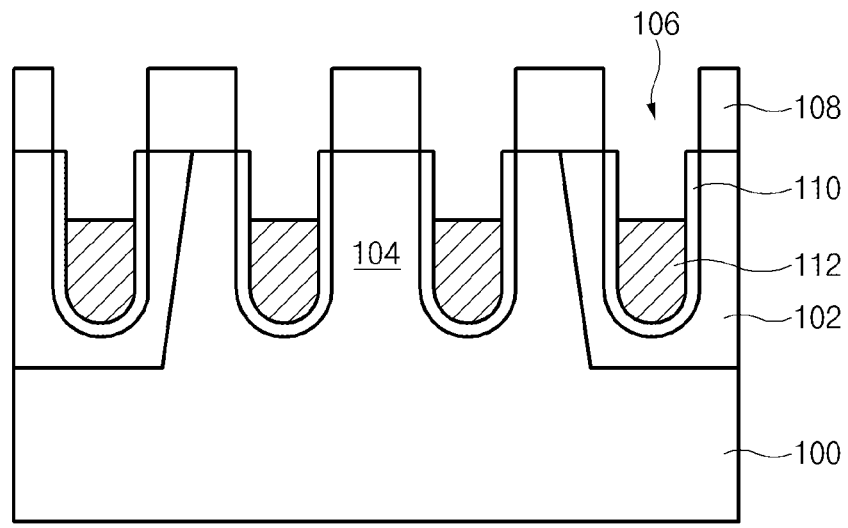

Referring to FIG. 2C, a sacrificial metal layer is formed on the semiconductor substrate 100 including the trench 106 and then an etching back process is performed to form a sacrificial metal pattern 112 in a lower portion of the trench 106. Here, the sacrificial metal pattern 112 defines a channel region.

Figure 2D:
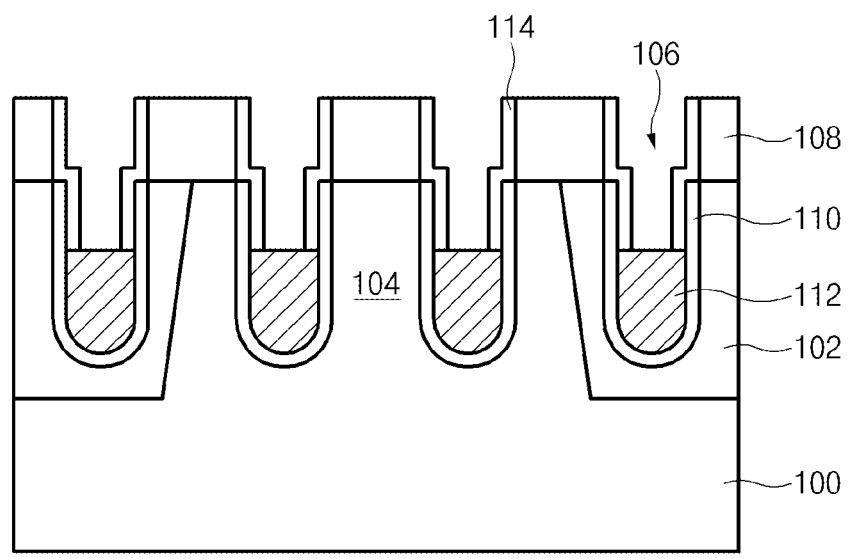

Referring to FIG. 2D, a spacer insulating layer is formed on the sacrificial metal pattern 112, the insulating layer 110, and the hard mask pattern 108 and an etching back process for the spacer insulating layer is performed to form a spacer pattern 114 only on sidewalls of the insulating layer 110 and the hard mask pattern 108. The spacer pattern 114 prevents a gate oxide layer from being damaged in the following process.

Figure 2E:
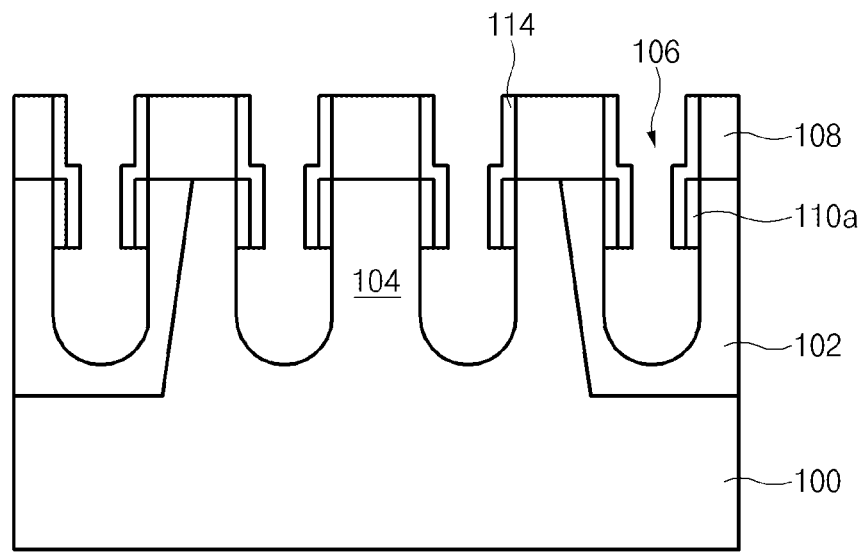

Referring to FIG. 2E, the sacrificial metal pattern 112, which fills the lower portion of the trench 106, is removed. A cleaning process is performed so that the insulating layer under the sacrificial metal pattern 112 is also removed, thus exposing a surface of the trench 106. As a result, a first gate oxide layer 110a is obtained along an upper inner wall of the trench. As described above, the first gate oxide layer 110a can prevent gate induced drain leakage (GIDL) current due to a direct tunneling between a gate electrode and a drain region.

Figure 2F:
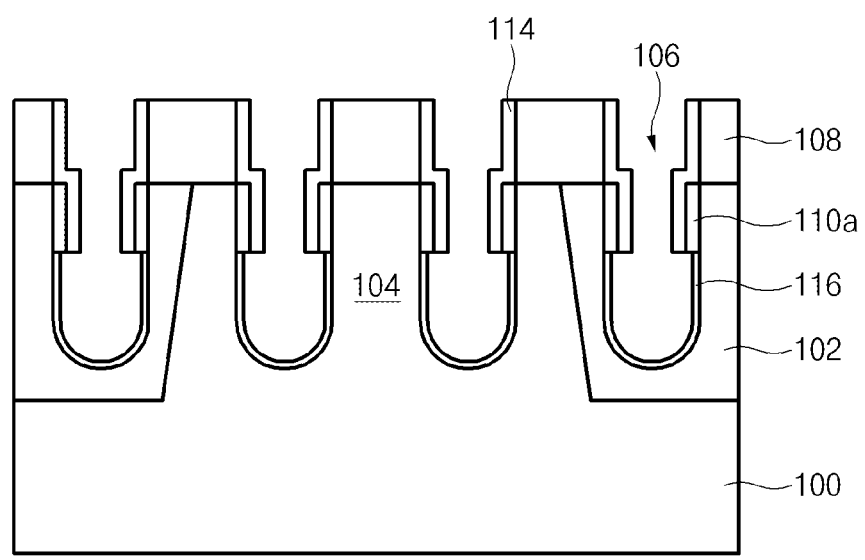

Referring to FIG. 2F, a second gate oxide layer 116 is formed over the surface of the trench 106 exposed by removing the first oxide layer 110a. Here, the second gate oxide layer 116 may be formed by performing an oxidation process on the semiconductor substrate 100. The second gate oxide layer 116 may have a shallower thickness than the first gate oxide layer 110a and may have a thickness of 50 Å to 60 Å. The area where the second gate oxide layer 116 is formed is an area in which a channel is to be formed. Accordingly, the second gate oxide layer 116 is thinly formed to easily control a gate.

Figure 2G:
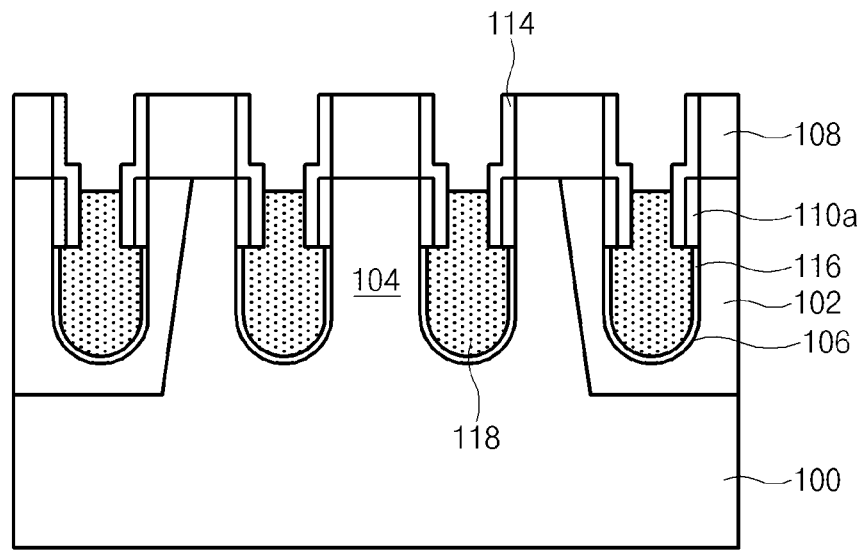

Referring to FIG. 2G, a gate conductive layer is formed within the trench 106 and then an etching back process is performed to form a gate 118 buried in the trench 106. The gate 118 may extend over the spacer pattern 114.

Figure 2H:
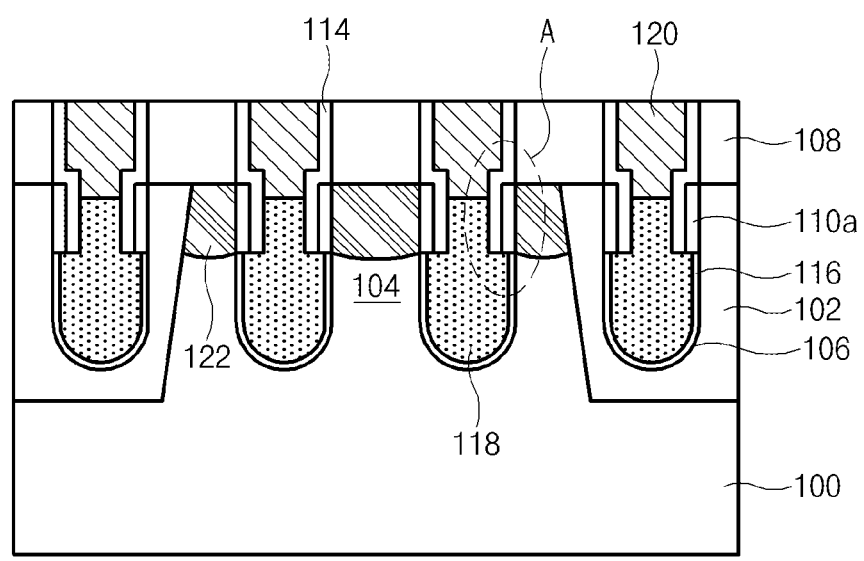

Referring to FIG. 2H, an insulating layer 120 is formed in the trench 106 to be over the gate 118 and an ion implantation process is performed on the semiconductor substrate 100 to form a junction region 122. Here, the junction region 122 may be formed at such a level that it overlaps with the space pattern 114 and the first gate oxide layer 110a. That is, the junction region 122 is spaced apart from the gate 118 by the thicknesses of the spacer pattern 114 and the first gate oxide layer 110a to suppress the direct tunneling effect in an "A" area, thereby reducing GIDL.

As described above, according to an exemplary embodiment of the present invention, the gate oxide layer is thickly formed in an overlapping area between the gate and the junction to reduce GIDL, thereby improving refresh characteristics and reducing parasitic capacitance to improve characteristics of the semiconductor device.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, comprising:
    forming a trench in a semiconductor substrate;
    forming an insulating layer over an inner surface of the trench;
    forming a sacrificial metal pattern over the insulating layer to fill a lower portion of the trench;
    forming a spacer pattern at a sidewall of the trench over the sacrificial metal pattern;
    removing the sacrificial metal pattern;
    removing the insulating layer using the spacer pattern as a mask to form a first gate oxide layer;
    forming a second gate oxide layer over a surface of the trench from which the sacrificial metal pattern is removed;
    forming a gate metal over the second gate oxide layer so as to extend between the spacer patterns; and
    forming a junction region at a side of the first gate oxide layer so that the spacer pattern and the first gate oxide layer are between the gate metal and the junction region.

2. The method of claim 1, wherein the forming the trench includes:
    forming a hard mask pattern over the semiconductor substrate; and
    etching the semiconductor substrate using the hard mask pattern as a mask.

3. The method of claim 1, wherein the forming the insulating layer over the inner surface of the trench includes oxidizing a surface of the trench.

4. The method of claim 3, wherein the forming the insulating layer over the inner surface of the trench includes forming an oxide layer having a thickness of 70 Å to 100 Å.

5. The method of claim 1, wherein the forming the sacrificial metal pattern includes:
    forming a sacrificial metal layer over the insulating layer; and
    performing an etching back process on the sacrificial metal layer so that the sacrificial metal layer remains in an area reserved for a channel.

6. The method of claim 1, wherein the forming the spacer pattern includes:
    forming a spacer insulating layer over the sacrificial metal pattern and the insulating layer; and
    performing an etching back process for the spacer insulating layer.

7. The method of claim 1, wherein the removing the insulating layer includes performing a cleaning process for the insulating layer.

8. The method of claim 1, wherein the forming the second oxide layer includes oxidizing a surface of the trench exposed by the spacer pattern.

9. The method of claim 8, wherein the forming the second oxide layer includes forming an oxide layer having a thickness of 50 Å to 60 Å.

10. The method of claim 1, the method further comprising:
    after the forming the gate metal, forming an insulating layer over the gate metal.

11. A method of manufacturing a semiconductor device, comprising:
    forming a trench in a substrate, wherein the trench includes a lower part located at a first level and an upper part located at a second level;
    forming an insulating layer over a surface of the trench at the first level and at the second level;
    forming a sacrificial metal pattern in the trench at the first level;
    forming a spacer pattern at a sidewall of the trench at the second level;
    removing the sacrificial metal pattern;
    removing the insulating layer at the first level and allowing the insulating layer at the second level to remain to form a first gate oxide layer;
    forming a gate electrode in the trench so as to extend from the first level to the second level; and
    forming a junction region in the substrate at a side of the first gate oxide layer at the second level.

* * * * *